(12) United States Patent
Li et al.

(10) Patent No.: US 10,978,515 B2
(45) Date of Patent: Apr. 13, 2021

(54) ORGANIC ELECTROLUMINESCENT DISPLAY PANEL WITH IMPROVED DISPLAY BRIGHTNESS AND FABRICATION METHOD THEREOF

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Zongxiang Li, Beijing (CN); Xi Chen, Beijing (CN); Liqing Yao, Beijing (CN); Jiamin Liao, Beijing (CN); Dahai Li, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 20 days.

(21) Appl. No.: 16/336,938

(22) PCT Filed: Jun. 26, 2018

(86) PCT No.: PCT/CN2018/092752
§ 371 (c)(1),
(2) Date: Mar. 27, 2019

(87) PCT Pub. No.: WO2019/041990
PCT Pub. Date: Mar. 7, 2019

(65) Prior Publication Data
US 2019/0267432 A1    Aug. 29, 2019

(30) Foreign Application Priority Data
Aug. 31, 2017 (CN) .......... 201710773222.0

(51) Int. Cl.
*G09G 3/3233* (2016.01)
*H01L 27/32* (2006.01)
(Continued)

(52) U.S. Cl.
CPC ....... *H01L 27/3209* (2013.01); *G09G 3/3275* (2013.01); *H01L 27/3244* (2013.01); *H01L 51/56* (2013.01)

(58) Field of Classification Search
CPC . G09G 3/3275; H01L 25/048; H01L 27/3209; H01L 27/3244; H01L 27/3267; H01L 51/5271; H01L 51/56
See application file for complete search history.

(56) References Cited

U.S. PATENT DOCUMENTS 8,410,682 B2 *  4/2013  Lee ............... H01L 25/048
                                               313/503
2004/0245531 A1* 12/2004 Fuii ................ H01L 27/156
                                                257/88
(Continued)

FOREIGN PATENT DOCUMENTS

CN    1878439 A    12/2006
CN  102981316 A     3/2013
(Continued)

OTHER PUBLICATIONS

Search Report and Written Opinion for International Application No. PCT/CN2018/092752 dated Sep. 27, 2018.
(Continued)

*Primary Examiner* — Ram A Mistry
(74) *Attorney, Agent, or Firm* — Calfee, Halter & Griswold LLP

(57) ABSTRACT

Disclosed is an organic electroluminescent display panel and a fabrication method thereof. The organic electroluminescent display panel includes: a first base substrate and a second base substrate, a plurality of first organic electroluminescent units disposed at intervals from each other on a side of the first base substrate facing the second base substrate; and a plurality of second organic electroluminescent units disposed at intervals from each other on a side of
(Continued)

the second base substrate facing the first base substrate. The plurality of first organic electroluminescent units is spaced apart from the plurality of second organic electroluminescent units in a direction perpendicular to an extending plane of the first base substrate. An orthographic projection of each first organic electroluminescent unit on the second base substrate at least partially overlaps with a corresponding second organic electroluminescent unit.

12 Claims, 6 Drawing Sheets

(51) Int. Cl.
  *G09G 3/3275* (2016.01)
  *H01L 51/56* (2006.01)

(56) References Cited

U.S. PATENT DOCUMENTS

| | | | |
|---|---|---|---|
| 2005/0140853 | A1 | 6/2005 | Ozeki et al. |
| 2006/0231842 | A1 | 10/2006 | Hirakata et al. |
| 2010/0176719 | A1* | 7/2010 | Hirakata ............... H01L 25/048 313/504 |
| 2014/0197388 | A1 | 7/2014 | Zhang |
| 2016/0203759 | A1 | 7/2016 | Han |
| 2017/0084213 | A1 | 3/2017 | Yang et al. |
| 2019/0267432 | A1 | 8/2019 | Li et al. |

FOREIGN PATENT DOCUMENTS

| | | |
|---|---|---|
| CN | 103094312 A | 5/2013 |
| CN | 204130539 U | 1/2015 |
| CN | 104880879 A | 9/2015 |
| CN | 105093553 A | 11/2015 |
| CN | 106647065 A | 5/2017 |
| CN | 107331693 A | 11/2017 |
| CN | 207082534 U | 3/2018 |
| KR | 20050027465 A | 11/2016 |

OTHER PUBLICATIONS

First Office Action for Chinese Patent Application No. 201710773222.0 dated Apr. 2, 2019.

* cited by examiner

ORGANIC ELECTROLUMINESCENT DISPLAY PANEL WITH IMPROVED DISPLAY BRIGHTNESS AND FABRICATION METHOD THEREOF

RELATED APPLICATION(S)

The present application is the U.S. national phase entry of PCT/CN2018/092752 filed on Jun. 26, 2018, which claims the benefit of Chinese Patent Application No. 201710773222.0 filed on Aug. 31, 2017, the entire disclosures of both are incorporated herein by reference.

TECHNICAL FIELD

The present disclosure relates to the field of display technology, in particular to an organic electroluminescent display panel and a fabrication method thereof.

BACKGROUND

Organic electroluminescent display panels are favored by more and more consumers due to their advantages such as being self-luminous, fast response, wide viewing angle, high flexibility and light weight.

As shown in FIG. 1, an organic electroluminescent display panel generally comprises in structure an array substrate 01 and a package cover (also referred to as a package layer) 02, wherein the package cover 02 is used for packaging, and the array substrate 01 is used for display. Specifically, the array substrate 01 comprises an anode 20, a cathode 30, and a functional layer 40 between the anode 20 and the cathode 30, which are all disposed on the base substrate 10. In the organic electroluminescent display panel, when current is applied to the anode 20 and the cathode 30, the functional layer 40 will emit light. The intensity of light emitted by the functional layer 40 is mainly related to the magnitude of the applied current and properties of the functional layer 40 itself, wherein the greater the current, the greater the luminous intensity from the functional layer 40. However, after the current increases to a certain value, the luminous intensity from the functional layer 40 will remain unchanged. Therefore, this makes the maximum luminous intensity from the functional layer 40 somewhat restricted. In particular, for a large-sized display panel, or under long-distance viewing conditions, the organic electroluminescent display panel is liable to cause great limitations in application due to insufficient brightness of the self-luminous structure.

SUMMARY

According to an aspect of the present disclosure, exemplary embodiments provide an organic electroluminescent display panel.

Specifically, the organic electroluminescent display panel comprises: a first base substrate and a second base substrate disposed opposite to each other; a plurality of first organic electroluminescent units disposed on a side of the first base substrate facing the second base substrate; and a plurality of second organic electroluminescent units disposed on a side of the second base substrate facing the first base substrate. An orthographic projection of each first organic electroluminescent unit on the second base substrate at least partially overlaps with a corresponding second organic electroluminescent unit.

According to an implementation, in the organic electroluminescent display panel provided by an exemplary embodiment, one of the second organic electroluminescent units, at least partially overlapping with the orthographic projection of one of the first organic electroluminescent units on the second base substrate, is configured to emit light of a same color as the one of the first organic electroluminescent units.

According to another implementation, in the organic electroluminescent display panel provided by an exemplary embodiment, the first organic electroluminescent units are disposed closer to a light exit surface of the organic electroluminescent display panel than the second organic electroluminescent units.

According to another implementation, in the organic electroluminescent display panel provided by an exemplary embodiment, at least one of the first organic electroluminescent units and the second organic electroluminescent units is configured to emit white light. Furthermore, the organic electroluminescent display panel further comprises: a color film layer disposed on a side of the first organic electroluminescent units away from the second organic electroluminescent units.

According to another implementation, the organic electroluminescent display panel provided by an exemplary embodiment further comprises: a reflective layer disposed on a side of the second organic electroluminescent units away from the first organic electroluminescent units.

According to another implementation, in the organic electroluminescent display panel provided by an exemplary embodiment, each second organic electroluminescent unit comprises a first electrode, a functional layer and a second electrode stacked on the second base substrate, and the first electrode is made of a reflective material.

According to another implementation, the organic electroluminescent display panel provided by an exemplary embodiment further comprises: a first planarization layer disposed on a side of the first organic electroluminescent units adjacent to the second organic electroluminescent units; a second planarization layer disposed on a side of the second organic electroluminescent units adjacent to the first organic electroluminescent units; and a post spacer disposed between the first planarization layer and the second planarization layer.

According to another implementation, the organic electroluminescent display panel provided by an exemplary embodiment further comprises a driving module. Specifically, the driving module is connected to the first organic electroluminescent units and the second organic electroluminescent units, and configured to drive the first organic electroluminescent units and the second organic electroluminescent units to emit light.

According to another implementation, in the organic electroluminescent display panel provided by an exemplary embodiment, the driving module is configured to drive the first organic electroluminescent unit and the second organic electroluminescent unit to emit light simultaneously.

According to another implementation, in the organic electroluminescent display panel provided by an exemplary embodiment, the driving module comprises a first sub-driving module and a second sub-driving module. Further, the first sub-driving module is connected to the first organic electroluminescent units and configured to drive the first organic electroluminescent units to emit light. Furthermore, the second sub-driving module is connected to the second organic electroluminescent units and configured to drive the second organic electroluminescent units to emit light.

According to another implementation, the organic electroluminescent display panel provided by an exemplary embodiment further comprises: a first signal line disposed on the first base substrate; and a second signal line disposed on the second base substrate. Further, the first sub-driving module is disposed on the first base substrate and is connected to the first signal line. Furthermore, the second sub-driving module is disposed on the second base substrate and is connected to the second signal line.

According to another implementation, the organic electroluminescent display panel provided by an exemplary embodiment further comprises: a first signal line disposed on the first base substrate; and a second signal line and a third signal line disposed on the second base substrate, wherein the first signal line is electrically connected to the third signal line by an anisotropic conductive film. Further, the first sub-driving module and the second sub-driving module are located on the second base substrate, wherein the first sub-driving module is connected to the third signal line, and the second sub-driving module is connected to the second signal line.

According to another implementation, the organic electroluminescent display panel provided by an exemplary embodiment further comprises: a first data signal line and a first driving signal line disposed on the first base substrate; and a second data signal line, a third data signal line and a second driving signal line disposed on the second base substrate, wherein the first data signal line is electrically connected to the third data signal line by an anisotropic conductive film, and the first driving signal line is electrically connected to the second driving signal line by an anisotropic conductive film. Further, the driving module comprises a first sub-driving module, a second sub-driving module and a gate driver on array unit located on the second base substrate, wherein the first sub-driving module is electrically connected to the third data signal line, the second sub-driving module is electrically connected to the second data signal line, and the gate driver on array unit is electrically connected to the second driving signal line.

According to another aspect of the present disclosure, exemplary embodiments further provide a fabrication method for an organic electroluminescent display panel. Specifically, the fabrication method comprises: forming a plurality of first organic electroluminescent units on a first base substrate; forming a plurality of second organic electroluminescent units on a second base substrate; and aligning the first base substrate with the second base substrate such that an orthographic projection of each first organic electroluminescent unit on the second base substrate at least partially overlaps with a corresponding second organic electroluminescent unit.

According to yet another aspect of the present disclosure, exemplary embodiments further provide an organic electroluminescent display panel. Specifically, the organic electroluminescent display panel comprises: a base substrate; a plurality of first organic electroluminescent units disposed at intervals from each other on the base substrate; and a plurality of second organic electroluminescent units disposed at intervals from each other on a side of the plurality of first organic electroluminescent units away from the base substrate. An orthographic projection of each first organic electroluminescent unit on the base substrate at least partially overlaps with an orthographic projection of a corresponding second organic electroluminescent unit on the base substrate.

According to another implementation, in the organic electroluminescent display panel provided by an exemplary embodiment, one of the second organic electroluminescent units, at least partially overlapping with the orthographic projection of one of the first organic electroluminescent units on the second base substrate, is configured to emit light of a same color as the one of the first organic electroluminescent units.

According to another implementation, in the organic electroluminescent display panel provided by an exemplary embodiment, the first organic electroluminescent units are disposed closer to a light exit surface of the organic electroluminescent display panel than the second organic electroluminescent units.

According to another implementation, in the organic electroluminescent display panel provided by an exemplary embodiment, at least one of the first organic electroluminescent units and the second organic electroluminescent units is configured to emit white light. Furthermore, the organic electroluminescent display panel further comprises: a color film layer disposed on a side of the first organic electroluminescent units away from the second organic electroluminescent units.

According to another implementation, the organic electroluminescent display panel provided by an exemplary embodiment further comprises: a first planarization layer disposed on a side of the first organic electroluminescent units adjacent to the second organic electroluminescent units, a second planarization layer disposed on a side of the second organic electroluminescent units adjacent to the first organic electroluminescent units; and a post spacer disposed between the first planarization layer and the second planarization layer.

According to another implementation, the organic electroluminescent display panel provided by an exemplary embodiment further comprises a driving module. Specifically, the driving module is connected to the first organic electroluminescent units and the second organic electroluminescent units, and configured to drive the first organic electroluminescent units and the second organic electroluminescent units to emit light.

BRIEF DESCRIPTION OF THE DRAWINGS

In order to illustrate the technical solutions in embodiments of the disclosure more clearly, the appended drawings needed to be used in the description of exemplary embodiments will be introduced briefly in the following. Obviously, the drawings in the following description are only some exemplary embodiments of the present disclosure, and for those of ordinary skills in the art, other embodiments can be obtained according to these drawings under the premise of not paying out creative work.

DETAILED DESCRIPTION

In the following, the technical solutions in embodiments of the present disclosure will be described clearly and completely in connection with the drawings in exemplary embodiments of the present disclosure. Obviously, the described embodiments are only part of the embodiments of the present disclosure, and not all of them. Based on the exemplary embodiments in the present disclosure, all other embodiments obtained by those of ordinary skills in the art under the premise of not paying out creative work pertain to the protection scope of the present disclosure.

In the following detailed description, the following reference numbers are used to refer to the various components as mentioned herein: 01—array substrate; 02—package cover; 10—base substrate; 20—anode; 21—first electrode of first organic electroluminescent unit; 22—first electrode of second organic electroluminescent unit; 30—cathode; 31—second electrode of first organic electroluminescent unit; 32—second electrode of second organic electroluminescent unit; 40—functional layer; 41—functional layer of first organic electroluminescent unit; 42—functional layer of second organic electroluminescent unit; 50—first base substrate; 60—second base substrate; 70—first organic electroluminescent unit; 701—first planarization layer; 80—second organic electroluminescent unit; 801—second planarization layer; 90—color film layer; 901—color resist unit; 902—black matrix pattern; 100—reflective layer; 110—post spacer; 120—signal line; 1201—first signal line; 1202—second signal line; 1203—third signal line; 1204—first data signal Line; 1205—first driving signal line; 1206—second data signal line; 1207—third data signal line; 1208—second driving signal line; 130—anisotropic conductive film; 140—first sub-driving module; 150—second sub-driving module; 160—first printed circuit board; 170—second printed circuit board; and 180—chip on film.

Figure 1:
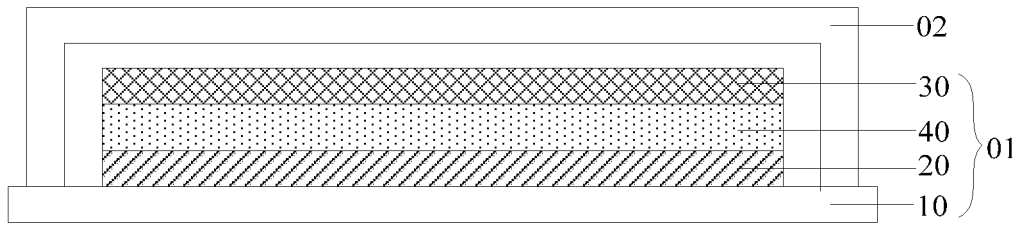
FIG. 1 shows a schematic structural diagram of an organic electroluminescent display panel according to the prior art.
Figure 2:
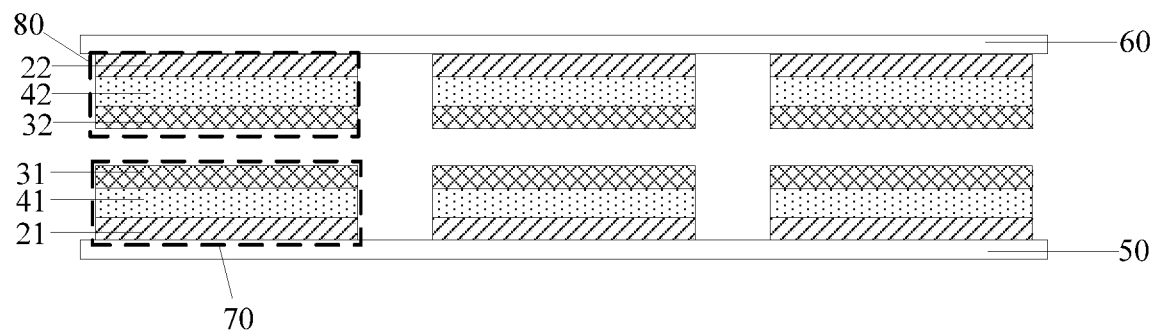
FIG. 2 shows a schematic structural diagram of an organic electroluminescent display panel according to an exemplary embodiment.

Embodiments of the present disclosure provide an organic electroluminescent display panel. As shown in FIG. 2, the organic electroluminescent display panel comprises a first base substrate 50 and a second base substrate 60 that are disposed opposite to each other. A plurality of first organic electroluminescent units 70 is disposed on the first base substrate 50 (e.g., on an upper surface thereof), and a plurality of second organic electroluminescent units 80 is disposed on the second base substrate 60 (e.g., on a lower surface thereof). An orthographic projection of each first organic electroluminescent unit 70 on the second base substrate 50 at least partially overlaps with a corresponding second organic electroluminescent unit 80. That is, the first organic electroluminescent units 70 are disposed in one-to-one correspondence with the second organic electroluminescent units 80. Herein, it should be noted that the expression of "at least partially overlap" as used in the present disclosure encompasses not only partial overlap but also complete overlap. This means that the orthographic projection of each first organic electroluminescent unit 70 on the second base substrate 50 may only partially overlap with a corresponding second organic electroluminescent unit 80, or it may completely overlap with a corresponding second organic electroluminescent unit 80. As an example, the ratio of overlap between the two may be, for example, 100% (i.e., fully overlap), 95% (i.e., partially overlap), and the like. All such overlaps that are readily recognized by those skilled in the art are falling within the scope of the present disclosure.

It should be noted that the first organic electroluminescent unit 70 and the second organic electroluminescent unit 80 may each comprise an anode, a cathode, and a functional layer disposed between the anode and the cathode. In addition to a light emitting layer, the functional layer may further comprise at least one of a hole transport layer, a hole injection layer, an electron transport layer, and an electron injection layer. Further, when the anodes of the organic electroluminescent units are electrically connected to the drains of the thin film transistors, the cathodes of the respective organic electroluminescent units may be connected to each other. That is, the cathodes are forming a single layer. Of course, alternatively, the cathodes of the respective organic electroluminescent units may also be independent of one another.

It should be noted that since the first organic electroluminescent units 70 are disposed in one-to-one correspondence with the second organic electroluminescent units 80, the first organic electroluminescent units 70 do not affect normal light emission of the second organic electroluminescent units 80, and vice versa. For example, light emitted by the first organic electroluminescent units 70 and light emitted by the second organic electroluminescent units 80 may both exit from the second base substrate 60. In this case, light emitted by the first organic electroluminescent units 70 can be transmitted through the second organic electroluminescent units 80. This means that the second organic electroluminescent units 80 are made of a transparent material.

In addition, it is also noted that the color of light emitted by the first organic electroluminescent units 70 and the second organic electroluminescent units 80 can be flexibly selected according to actual needs. For example, the color of light emitted by the first organic electroluminescent units 70 may be the same as that of the second organic electroluminescent units 80. Alternatively, the color of light emitted by the first organic electroluminescent units 70 may also be different from that of the second organic electroluminescent units 80. Further, any one of the three primary colors of light can be emitted by the first organic electroluminescent units 70 and the second organic electroluminescent units 80. Of course, white light, or light of other colors than the three primary colors, may also be emitted by the first organic electroluminescent units 70 and the second organic electroluminescent units 80.

Further, it should be noted that the brightness of light emitted by the first organic electroluminescent unit 70 may be the same as or different from that of the second organic electroluminescent unit 80 that is disposed correspondingly thereto.

Finally, it should be noted that the expression of "the first organic electroluminescent units 70 are disposed in one-to-one correspondence with the second organic electroluminescent units 80" means that in a direction perpendicular to an extending plane of the organic electroluminescent display panel, the plurality of first organic electroluminescent units 70 are disposed in one-to-one correspondence with the plurality of second organic electroluminescent units 80, and for example, each sub-pixel region comprises a first organic electroluminescent unit 70 and a second organic electroluminescent unit 80 that are disposed correspondingly to each other.

Exemplary embodiments provide an organic electroluminescent display panel. The organic electroluminescent display panel comprises a plurality of first organic electroluminescent units 70 disposed on a first base substrate 50 and a plurality of second organic electroluminescent units 80 disposed on a second base substrate 60, wherein the first organic electroluminescent units 70 and the second organic electroluminescent units 80 are also configured to emit light. In a conventional organic electroluminescent display panel, there is only one organic electroluminescent unit per sub-pixel unit. However, in the organic electroluminescent display panel according to exemplary embodiments, each sub-pixel unit is provided with two organic electroluminescent units. Therefore, the organic electroluminescent display panel provided by embodiments of the present disclosure increases the display brightness of the organic electroluminescent display panel, so that the maximum brightness of the organic electroluminescent display panel is larger, thereby facilitating applications of the large-sized display panel and observation from a distance. Further, in an embodiment of the present disclosure, the first organic electroluminescent units 70 and the second organic electroluminescent units 80 are disposed on two base substrates, respectively. On the one hand, this avoids the mutual influence between electrodes in the first organic electroluminescent units 70 and electrodes in the second organic electroluminescent units 80, thereby ensuring the display quality; and on the other hand, this also avoids the mutual influence between the first organic electroluminescent units 70 and the second organic electroluminescent units 80 during fabrication, thereby simplifying the fabricating process.

Further, when the brightness of light emitted by a first organic electroluminescent unit 70 and a second organic electroluminescent unit 80 that are disposed correspondingly to each other is completely different, the number of gray levels of the organic electroluminescent display panel can also be increased.

Optionally, the first organic electroluminescent unit 70 and the second organic electroluminescent unit 80 that are disposed correspondingly to each other emit light of the same color.

As an example, the first organic electroluminescent unit 70 and the second organic electroluminescent unit 80 that are disposed correspondingly to each other may both emit white light. Of course, alternatively, the first organic electroluminescent unit 70 and the second organic electroluminescent unit 80 that are disposed correspondingly to each other may also emit one of the three primary colors of light.

In an exemplary embodiment, if the first organic electroluminescent unit 70 and the second organic electroluminescent unit 80 that are disposed correspondingly to each other emit the same color of light, the color of light emitted from each sub-pixel unit will be the same, and thus the color of light emitted from a pixel unit can be easily controlled.

Optionally, the first organic electroluminescent units 70 are disposed closer to the light exit side (i.e., the display side) of the entire organic electroluminescent display panel than the second organic electroluminescent units 80. As shown in FIG. 2, each first organic electroluminescent unit 70 comprises a first electrode 21, a second electrode 31, and a functional layer 41 disposed between the first electrode 21 and the second electrode 31, wherein the first electrode 21 and the second electrode 31 are transparent.

In this case, since the first electrode 21 and the second electrode 31 of the first organic electroluminescent unit 70 are transparent, when the first organic electroluminescent unit 70 is closer to the display side than the second organic electroluminescent unit 80, light emitted by the second organic electroluminescent unit 80 can transmit through the first organic electroluminescent unit 70.

Further optionally, as shown in FIG. 3(*a*) and FIG. 3(*b*), in the case where the first organic electroluminescent units 70 and/or the second organic electroluminescent units 80 emit white light (i.e., all the first organic electroluminescent units 70 disposed on the first base substrate 50 emit white light and/or all the second organic electroluminescent units 80 disposed on the second base substrate 60 emit white light), the organic electroluminescent display panel may further comprise a color film layer 90 disposed on a side of the first organic electroluminescent units 70 away from the second organic electroluminescent units 80.

Specifically, the color film layer 90 may comprise a plurality of color resist units 901. For example, the color resist units 901 may comprise red color resist units (R), green color resist units (G), or blue color resist units (B). Advantageously, each color resist unit 901 should be disposed corresponding to a first organic electroluminescent unit 70 or a second organic electroluminescent unit 80.

Here, a black matrix (BM) 902 may be disposed between the respective color resist units 901.

It should be noted that when one of the first organic electroluminescent unit 70 and the second organic electroluminescent unit 80 that are disposed correspondingly to each other emits white light but the other emits one of three primary colors, the color of the color resisting unit 901 should be the one of the three primary colors. Illustratively, when the first organic electroluminescent unit 70 emits white light but the second organic electroluminescent unit 80 that is disposed correspondingly thereto emits red light, the color resisting unit 901 corresponding to the red-emitting, second organic electroluminescent unit 80 is a red color resistance unit.

Here, it should be noted that the color film layer 90 can be disposed at any suitable position according to actual needs. As an example, as shown in FIG. 3(*a*), the color film layer 90 may be disposed between the first organic electroluminescent units 70 and the first base substrate 50. Alternatively, as shown in FIG. 3(*b*), the color film layer 90 may also be disposed on a side of the first base substrate 50 away from the first organic electroluminescent units 70.

When the color film layer 90 is disposed on a side of the first base substrate 50 away from the first organic electroluminescent units 70, a protective layer may also be disposed on a side of the color film layer 90 away from the first base substrate 50, in order to prevent unintentional destruction of the color film layer 90 during the fabrication of organic electroluminescent display panel.

Further, a polarizer (POL) may be disposed on a side of the first base substrate 50 away from the first organic electroluminescent unit 70.

According to an exemplary embodiment, the organic electroluminescent display panel further comprises a color film layer 90. Thus, light emitted by the first organic electroluminescent units 70 and the second organic electroluminescent units 80 can be turned into three primary colors of light after transmitting through the color film layer 90. Therefore, the organic electroluminescent display panel can realize color display.

Figure 4A:
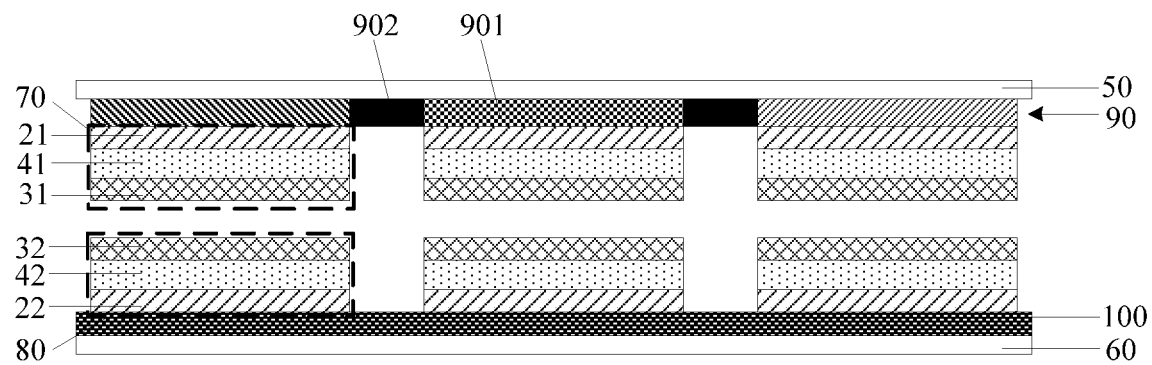
FIG. 4(a) shows a schematic structural diagram of an organic electroluminescent display panel comprising a reflective layer according to an exemplary embodiment.
Figure 4B:
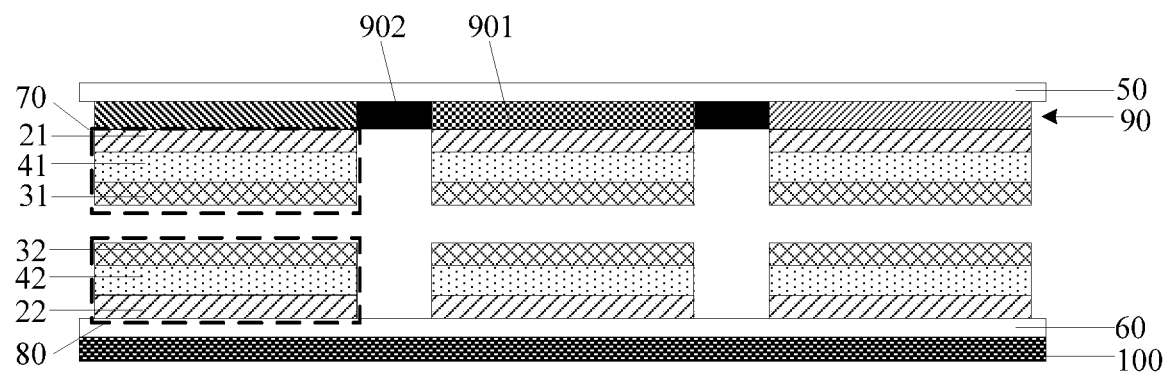
FIG. 4(b) shows a schematic structural diagram of an organic electroluminescent display panel comprising a reflective layer according to another exemplary embodiment.

Optionally, as shown in FIG. 4(a) and FIG. 4(b), the organic electroluminescent display panel may further comprise a reflective layer 100 disposed on a side of the second organic electroluminescent units 80 away from the first organic electroluminescent units 70.

Specifically, the reflective layer 100 can be formed using any suitable reflective material, such as a material having a high reflectivity. For example, the reflective material may be at least one of silver (Ag), aluminum (Al), or chromium alloy.

It should be noted that if the first electrode in a second organic electroluminescent unit 80 is closer to the second base substrate 60 than the second electrode, the reflective layer 100 may also be used as the first electrode of the second organic electroluminescent unit 80. In this case, the first electrode is a reflective electrode. That is to say, the first electrode can function both to drive the function layer to emit light and to reflect light, thereby functioning as the reflective layer 100.

Here, the reflective layer 100 can be disposed at any suitable position. As shown in FIG. 4(a), the reflective layer 100 may be disposed between the second organic electroluminescent units 80 and the second base substrate 60. Alternatively, as shown in FIG. 4(b), the reflective layer 100 may also be disposed on a side of the second base substrate 60 away from the second organic electroluminescent units 80. When the reflective layer 100 is disposed on a side of the second base substrate 60 away from the second organic electroluminescent units 80, a protective layer may also be disposed on a side of the reflective layer 100 away from the second base substrate 60, in order to prevent unintentional destruction of the reflective layer 100 during the fabrication of organic electroluminescent display panel.

According to an exemplary embodiment, the organic electroluminescent display panel further comprises a reflective layer 100. Thus, when light emitted by the first organic electroluminescent units 70 and the second organic electroluminescent units 80 is incident on the reflective layer 100, it is reflected by the reflective layer 100, thereby finally exiting from the display side. In this way, the utilization of light emitted by the first organic electroluminescent units 70 and the second organic electroluminescent units 80 can be improved.

Figure 3A:
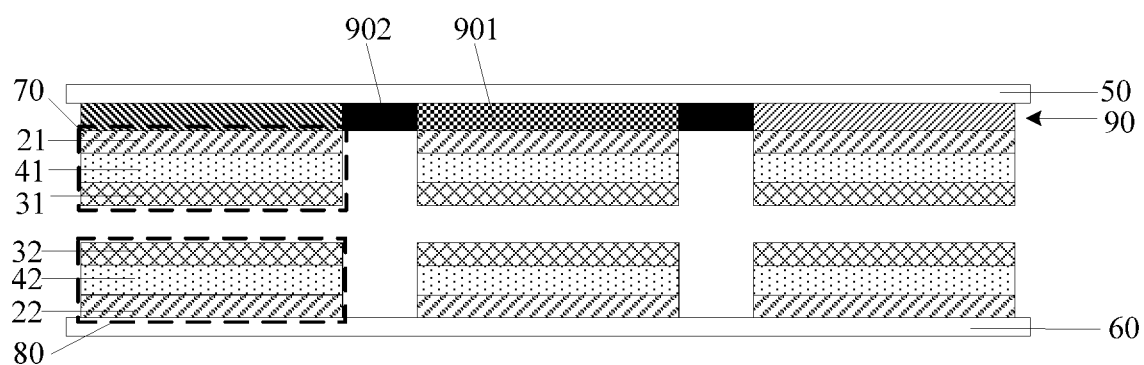
FIG. 3(a) shows a schematic structural diagram of an organic electroluminescent display panel comprising a color film layer according to an exemplary embodiment.
Figure 3B:
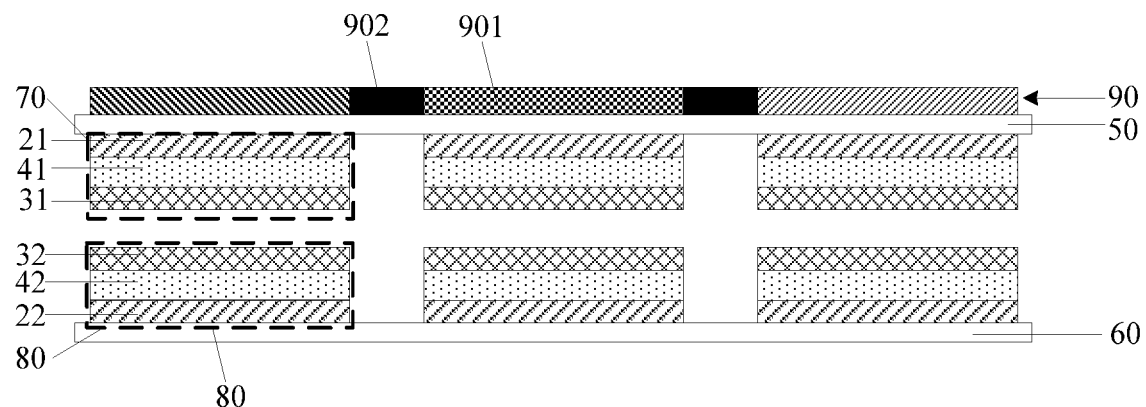
FIG. 3(b) shows a schematic structural diagram of an organic electroluminescent display panel comprising a color film layer according to another exemplary embodiment.

Optionally, as shown in FIGS. 3(a) and 3(b), the second organic electroluminescent unit 80 may comprises a first electrode 22, a functional layer 42, and a second electrode 32 disposed sequentially on the second base substrate 60, wherein the first electrode 22 is made of a reflective material.

As an example, the first electrode 22 can be an anode and the second electrode 32 can be a cathode. Of course, in other examples, the first electrode 22 can be a cathode and the second electrode 33 can be an anode.

Here, it should be noted that the first electrode 22 may be formed using any suitable material, as long as it has a high reflectance. For example, the first electrode 22 may be formed by using at least one of silver (Ag), aluminum (Al), or chromium alloy.

According to an exemplary embodiment, the first electrode 22 of the second organic electroluminescent unit 80 is made of a reflective material. In this way, when light emitted by the first organic electroluminescent unit 70 and the second organic electroluminescent unit 80 is incident on the first electrode 22 of the second organic electroluminescent unit 80, it can be reflected by the first electrode 22 and exits eventually from the display side. Thereby, the utilization ratio of light emitted by the first organic electroluminescent units 70 and the second organic electroluminescent units 80 is increased.

Figure 5:
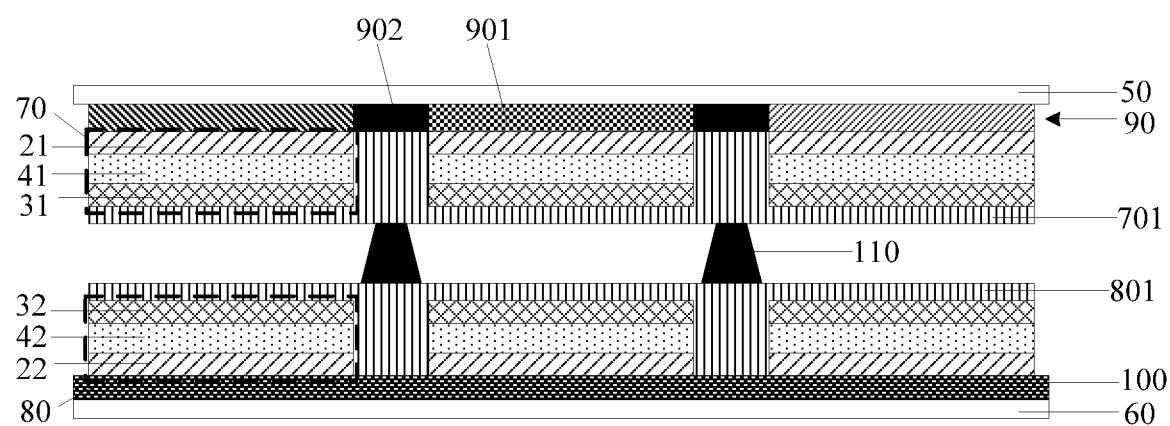
FIG. 5 shows a schematic structural diagram of an organic electroluminescent display panel comprising a planarization layer and a post spacer according to an exemplary embodiment.

Optionally, as shown in FIG. 5, the organic electroluminescent display panel may further comprise: a first planarization layer 701 disposed on a side of the first organic electroluminescent units 70 adjacent to the second organic electroluminescent units 80; a second planarization layer 801 disposed on a side of the second organic electroluminescent units 80 adjacent to the first organic electroluminescent units 70; and a post spacer (PS) 110 disposed between the first planarization layer 701 and the second planarization layer 801.

Here, it should be noted that the post spacer 110 should be disposed in a region corresponding to the black matrix pattern 902 in order to avoid unfavorable blocking of light.

Those skilled in the art will readily appreciate that the first planarization layer 701 and the second planarization layer 801 can be formed by using any suitable material. For example, the first planarization layer 701 and the second planarization layer 801 may be formed of at least one of silicon nitride ($SiN_x$), silicon oxide ($SiO_x$), or silicon oxynitride ($SiO_xN_y$).

According to an exemplary embodiment of the present disclosure, the first planarization layer 701 is disposed on a side of the first organic electroluminescent units 70 adjacent to the second organic electroluminescent units 80, and the second planarization layer 801 is disposed on a side of the second organic electroluminescent units 80 adjacent to the first electroluminescent units 70. Thus, after aligning between the first base substrate 50 provided with the first organic electroluminescent units 70 and the second base substrate 60 provided with the second organic electroluminescent units 80, the distance between the first organic electroluminescent units 70 and the second organic electroluminescent units 80 can be ensured equal or approximately equal everywhere. Therefore, it is ensured that light emitted from the organic electroluminescent display panel is uniform across the entire panel. Further, a post spacer 110 may be disposed between the first planarization layer 701 and the second planarization layer 801. Thus, the first organic electroluminescent units 70 and the second organic electroluminescent units 80 can be kept at a certain distance, thereby avoiding the mutual influence between electrodes of the first organic electroluminescent units 70 and electrodes of the second organic electroluminescent units 80.

Optionally, the organic electroluminescent display panel further comprises a driving module. Specifically, the driving module is connected to the first organic electroluminescent units 70 and the second organic electroluminescent units 80, and is configured to drive the first organic electroluminescent units 70 and the second organic electroluminescent units 80 to emit light.

As an example, when the organic electroluminescent display panel is a general display panel, the driving module may comprise a source driving module and a gate driving module. Alternatively, when the organic electroluminescent display panel is a gate driver on array (GOA) display panel, the driving module may comprise a source driving module and a gate driver on array unit (i.e., a GOA unit).

Here, it should be noted that the first organic electroluminescent units 70 and the second organic electroluminescent units 80 may be connected to the same driving module, and the first organic electroluminescent units 70 and the second organic electroluminescent units 80 are simultaneously driven by the same driving module to emit light. In this case, the brightness of light emitted by the first organic electroluminescent units 70 and the brightness of light emitted by the second organic electroluminescent units 80 are the same. Of course, alternatively, the driving module may also comprise a first sub-driving module and a second sub-driving module, wherein the first organic electroluminescent units 70 and the second organic electroluminescent units 80 are driven respectively by the first sub-driving module and the second sub-driving module to emit light. In this case, the brightness of light emitted by the first organic electroluminescent units 70 may be the same as or different from the brightness of light emitted by the second organic electroluminescent units 80.

In an exemplary embodiment, the first organic electroluminescent units 70 and the second organic electroluminescent units 80 can be driven to emit light by providing a driving module.

Optionally, the driving module may be configured to drive the first organic electroluminescent units 70 and the second organic electroluminescent units 80 to emit light simultaneously.

When the driving module drives the first organic electroluminescent units 70 and the second organic electroluminescent units 80 to emit light simultaneously, signal lines for driving the first organic electroluminescent units 70 to emit light and signal lines for driving the second organic electroluminescent units 80 to emit light are connected to the drive module. Thus, the driving module can drive the first organic electroluminescent units 70 and the second organic electroluminescent units 80 to emit light simultaneously. Alternatively, among the signal lines for driving the first organic electroluminescent units 70 to emit light and the signal lines for driving the second organic electroluminescent units 80 to emit light, the same type of signal lines are electrically connected, and the driving module is connected to the signal lines for driving the first organic electroluminescent units 70 to emit light or the signal lines for driving the second organic electroluminescent units 80 to emit light. In this way, the first organic electroluminescent units 70 and the second organic electroluminescent units 80 can be driven simultaneously to emit light.

According to the above description, among the signal lines for driving the first organic electroluminescent units 70 to emit light and the signal lines for driving the second organic electroluminescent units 80 to emit light, the same type of signal lines are electrically connected. Illustratively, in the first organic electroluminescent unit 70 and the second organic electroluminescent unit 80 that are disposed correspondingly to each other, the data line for driving the first organic electroluminescent unit 70 to emit light and the data line for driving the second organic electroluminescent unit 80 to emit light are electrically connected, and at the same time, the gate line for driving the first organic electroluminescent unit 70 to emit light and the gate line for driving the second organic electroluminescent unit 80 to emit light are electrically connected.

Figure 6:
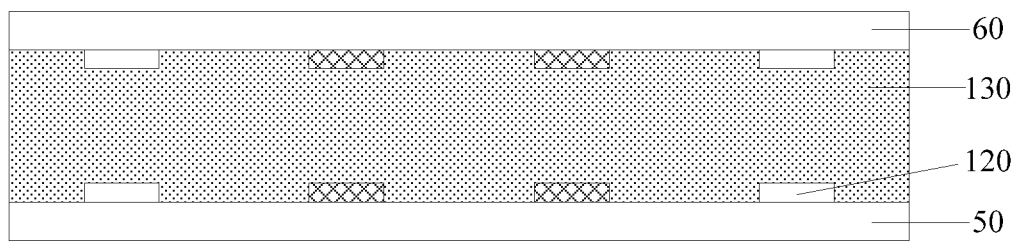
FIG. 6 shows a schematic structural diagram of a signal line on a first base substrate and a signal line on a second base substrate that are electrically connected by an anisotropic conductive film, according to an exemplary embodiment.

Referring to FIG. 6, signal lines 120 for driving the first organic electroluminescent units 70 to emit light and signal lines 120 for driving the second organic electroluminescent units 80 to emit light may be electrically connected by an anisotropic conductive film 130. According to characteristics of the anisotropic conductive film 130, the anisotropic conductive film 130 is conductive in the Z-axis direction, and the anisotropic conductive film 130 is insulated in the XY plane.

It should be noted that, since the driving module is configured to simultaneously drive the first organic electroluminescent units 70 and the second organic electroluminescent units 80 to emit light, the brightness of light emitted by the first organic electroluminescent unit 70 and the second organic electroluminescent unit 80 that are disposed correspondingly to each other is the same.

According to an exemplary embodiment, since the driving module is configured to simultaneously drive the first organic electroluminescent units 70 and the second organic electroluminescent units 80 to emit light, only one driving module needs to be disposed in the organic electroluminescent display panel. Further, it is also possible to control the first organic electroluminescent unit 70 and the second organic electroluminescent unit 80 to emit light simultaneously.

Figure 7:
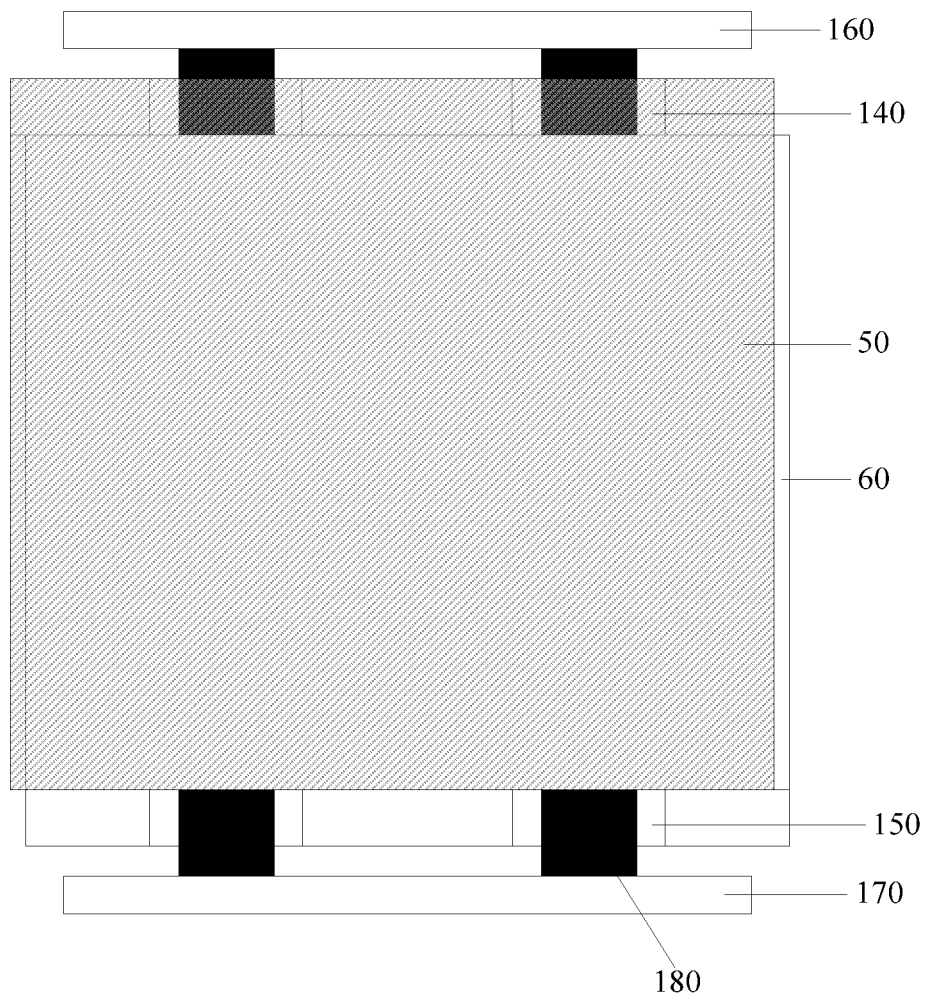
FIG. 7 shows a schematic structural diagram of a first sub-driving module disposed on a first base substrate and a second sub-driving module disposed on a second base substrate, according to an exemplary embodiment.
Figure 8:
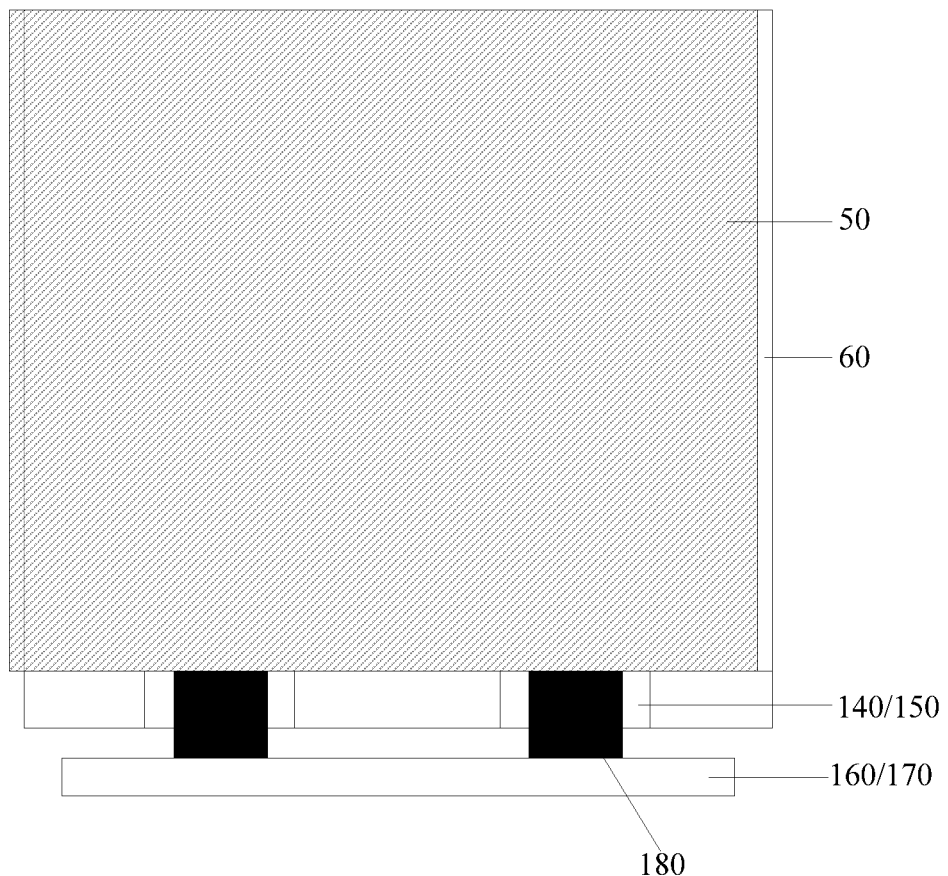
FIG. 8 shows a schematic structural diagram of a first sub-driving module and a second sub-driving module disposed on a second base substrate according to an exemplary embodiment.

Optionally, as shown in FIG. 7 and FIG. 8, the driving module may comprise a first sub-driving module 140 and a second sub-driving module 150. Specifically, the first sub-driving module 140 is connected to the first organic electroluminescent units 70 and configured to drive the first organic electroluminescent units 70 to emit light. Similarly, the second sub-driving module 150 is connected to the second organic electroluminescent units 80 and configured to drive the second organic electroluminescent units 80 to emit light.

It is to be noted that, in FIG. 7 and FIG. 8, for convenient illustration of the first base substrate 50, the second base substrate 60, and the organic electroluminescent units and other film layers between the first base substrate 50 and the second base substrate 60, the first base substrate 50 and the second base substrate 60 are shown as not completely overlapping in the horizontal direction in the drawing. However, having benefited from teachings of the present disclosure, those skilled in the art will readily appreciate that the first base substrate 50 and the second base substrate 60 may be completely overlapped in the horizontal direction of the drawing.

Here, in an exemplary embodiment, as shown in FIG. 7, the first sub-driving module 140 may be connected to a first printed circuit board (PCB) 160, and the second sub-driving module 150 may be connected to a second printed circuit board 170. Alternatively, as shown in FIG. 8, both the first sub-driving module 140 and the second sub-driving module 150 may be connected to the same printed circuit board. When the first sub-driving module 140 is connected to the first printed circuit board 160, and the second sub-driving module 150 is connected to the second printed circuit board 170, the control unit disposed on the first printed circuit board 160 and the control unit disposed on the second printed circuit board 170 can control the first sub-driving module 140 and the second sub-driving module 150 respectively, such that the first sub-driving module 140 and the second sub-driving module 150 can operate independently.

Illustratively, the control unit disposed on the first printed circuit board 160 may control the first sub-driving module 140 to cause the first organic electroluminescent units 70 to emit light. In contrast, the control unit disposed on the second printed circuit board 170 may control the second sub-driving module 150 to cause the second organic electroluminescent units 80 to emit no light. Alternatively, in other exemplary embodiments, the control unit disposed on the first printed circuit board 160 may control the first sub-driving module 140 to cause the first organic electroluminescent units 70 to emit no light, and the control unit disposed on the second printed circuit board 170 may control the second sub-driving module 150 to cause the second organic electroluminescent units 80 to emit light. Further, it is also possible for the control unit disposed on the first printed circuit board 160 and the control unit disposed on the second printed circuit board 170 to control the first sub-driving module 140 and the second sub-driving module 150 respectively, such that the first organic electroluminescent units 70 and the second organic electroluminescent units 80 both emit light. In such a case, the brightness of light emitted by the first organic electroluminescent units 70 and the brightness of light emitted by the second organic electroluminescent units 80 may be the same or different.

Further, as shown in FIG. 7 and FIG. 8, the driving module and the printed circuit board may be electrically connected by a chip on film (COF) 180.

According to an exemplary embodiment, the driving module may include the first sub-driving module 140 and the second sub-driving module 150. Thus, the first sub-electroluminescent units 70 and the second sub-electroluminescent units 80 can be driven to emit light by using the first sub-driving module 140 and the second sub-driving module 150 respectively. In this way, the first organic electroluminescent units 70 can be controlled independently from the second organic electroluminescent units 80.

Alternatively, as shown in FIG. 7, a first signal line may be disposed on the first base substrate 50, and a second signal line may be disposed on the second base substrate 60. In this case, further, the first sub-driving module 140 may be disposed on the first base substrate 50 and connected to the first signal line. Meanwhile, the second sub-driving module 150 may be disposed on the second base substrate 60 and connected to the second signal line.

As an example, the first sub-driving module 140 may be disposed on the first base substrate 50 and connected to the first signal line, for driving the first organic electroluminescent units 70 to emit light. Alternatively, the second sub-driving module 150 may be disposed on the second base substrate 60 and connected to the second signal line, for driving the second organic electroluminescent units 80 to emit light.

Here, further, the first sub-driving module 140 may be disposed on the first base substrate 50 and connected to the first printed circuit board 160. Meanwhile, the second sub-driving module 150 may be disposed on the second base substrate 60 and connected to the second printed circuit board 170. In this way, the first printed circuit board 160 and the second printed circuit board 170 can independently control the first sub-driving module 140 and the second sub-driving module 150, respectively, thereby driving the first organic electroluminescent units 70 and the second organic electroluminescent units 80 to emit light.

According to an exemplary embodiment, the first sub-driving module 140 and the second sub-driving module 150 may be disposed on the two base substrates, respectively. In this way, each sub-driving module is easily connected to the signal line disposed on the corresponding substrate.

Figure 9:
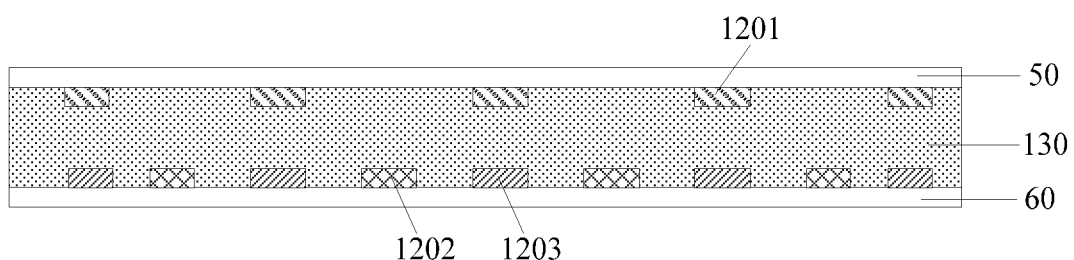
FIG. 9 shows a schematic structural diagram of a signal line on a first base substrate that is connected indirectly to a second base substrate according to an exemplary embodiment.

Optionally, as shown in FIG. 9, a first signal line 1201 may be disposed on the first base substrate 50, and a second signal line 1202 and a third signal line 1203 may be disposed on the second base substrate 60. Further, the first signal line 1201 is electrically connected to the third signal line 1203 by the anisotropic conductive film 130. As shown in FIG. 8, the first sub-driving module 140 and the second sub-driving module 150 are both located on the second base substrate 60, wherein the first sub-driving module 140 is connected to the third signal line 1203, and the second sub-driving module 150 is connected to the second signal line 1202.

Here, since the first sub-driving module 140 and the second sub-driving module 150 are both located on the second base substrate 60, the first signal line 1201 on the first base substrate 50 can be connected indirectly to the second base substrate 60 (specifically, the third signal line 1203 disposed thereon) by the anisotropic conductive film 130, to facilitate connection with the first sub-driving module 140. It should be noted that both of the first sub-driving module 140 and the second sub-driving module 150 may also be located on the first base substrate 50. In this way, the second signal line 1202 on the second base substrate 60 can also be connected indirectly to the first base substrate 50 by the anisotropic conductive film 130, to facilitate connection with the second sub-driving module 150.

Further, as shown in FIG. 8, the first sub-driving module 140 and the second sub-driving module 150 may be both located on the second base substrate 60, and the first sub-driving module 140 and the second sub-driving module 150 are connected to the same printed circuit board. In this case, the first sub-driving module 140 and the second sub-driving module 150 can be controlled simultaneously by the control unit on the printed circuit board, thereby causing the first organic electroluminescent units 70 and the second organic electroluminescent units 80 to emit light simultaneously. Alternatively, the first sub-driving module 140 and the second sub-driving module 150 can also be controlled separately by the control unit on the printed circuit board. In this case, the first sub-driving module 140 and the second sub-driving module 150 are connected to the same printed circuit board. In view of above, in an embodiment of the present disclosure, advantageously, the first sub-driving module 140 and the second sub-driving module 150 may be disposed at the same side of the upper or lower surface of the same base substrate.

Further, the first signal line 1201 on the first base substrate 50 may be connected indirectly to the third signal line 1203 on the second base substrate 60. Further, according to an embodiment of the present disclosure, the second signal line 1202 and the third signal line 1203 may be spaced apart to prevent unevenness in resistance.

According to an exemplary embodiment, in the cutting process after the first base substrate 50 provided with the first organic electroluminescent units 70 and the second base substrate 60 provided with the second organic electroluminescent units 80 are aligned with each other, since the first sub-driving module 140 and the second sub-driving module 150 are disposed on the first base substrate 50 and the second base substrate 60 respectively, it is necessary to perform cutting from the front and back surfaces of the organic electroluminescent display panel. Further, such cutting of the first base substrate 50 and the second base substrate 60 is not an edge-aligned cutting. Thus, it is difficult to take out the organic electroluminescent display panel after the cutting is completed. Based on this, in an exemplary embodiment, optionally, the first sub-driving module 140 and the second sub-driving module 150 may be disposed on the same base substrate, for example, on the second base substrate 60, thereby reducing the difficulty in fabricating the organic electroluminescent display panel.

Figure 10:
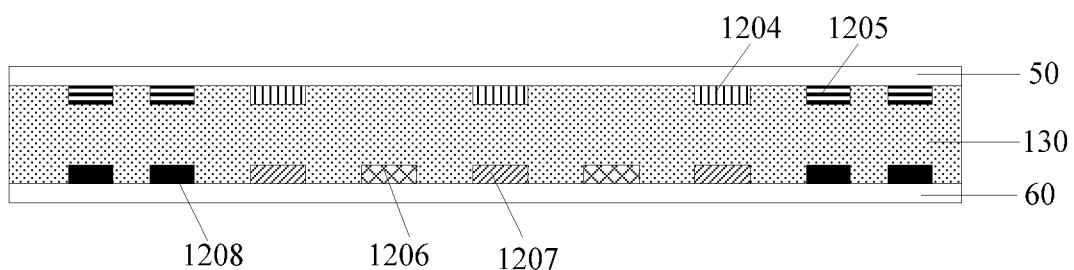
FIG. 10 shows a schematic structural diagram of a first driving signal line and a second driving signal line that are electrically connected to each other according to an exemplary embodiment.

Optionally, as shown in FIG. 10, the first base substrate 50 may be provided with a first data signal line 1204 and a first gate driver on array signal line 1205 (also referred to as a GOA signal line), while the second base substrate 60 may be provided with a second data signal line 1206, a third data signal line 1207, and a second gate driver on array signal line 1208. Further, the first data signal line 1204 is electrically connected to the third data signal line 1207 by the anisotropic conductive film 130, and the first gate driver on array signal line 1205 is electrically connected to the second gate driver on array signal line 1208 by the anisotropic conductive film 130. Further, the driving module may include a first source driving module, a second source driving module, and a gate driver on array unit (also referred to as a GOA unit) located on the second base substrate 60. The first source driving module is electrically connected to the third data signal line 1207, the second source driving module is electrically connected to the second data signal line 1206, and the gate driver on array unit is electrically connected to the second gate driver on array signal line 1208.

Here, it should be noted that the first source driving module, the second source driving module, and the gate driver on array unit may also be located on the first base substrate 50. In this case, the signal lines on the second base substrate 60 should be connected indirectly to the first base substrate 50. Further, in an embodiment of the present disclosure, further optionally, the second data signal line 1206 and the third data signal line 1207 are spaced apart, so that resistance unevenness can be prevented.

Specifically, the first gate driver on array signal line 1205 is electrically connected to the second gate driver on array signal line 1208 by the anisotropic conductive film 130, and the gate driver on array unit is electrically connected to the second gate driver on array signal line 1208. Thus, scan signals can be input simultaneously to the first gate driver on array signal line 1205 and the second gate driver on array signal line 1208 by the gate driver on array unit.

Further, the first source driving module and the second source driving module are electrically connected to the third data signal line 1207 and the second data signal line 1206 respectively, and are used to provide data signals to the third data signal line 1207 and the second data signal line 1206 respectively. In this way, the first organic electroluminescent units 70 and the second organic electroluminescent units 80 can be driven to emit light. Since the first source driving module and the second source driving module independently provide data signals to the third data signal line 1207 and the second data signal line 1206 respectively, the brightness of light emitted by the first organic electroluminescent unit 70 and the second organic electroluminescent unit 80 that are disposed correspondingly to each other may be the same or different. When the brightness of light emitted by the first organic electroluminescent unit 70 and the second organic electroluminescent unit 80 that are disposed correspondingly to each other are different, the number of gray levels of the organic electroluminescent display panel can also be increased.

According to an exemplary embodiment, since the first gate driver on array signal line 1205 and the second gate driver on array signal line 1208 are electrically connected, one gate driver on array unit may be disposed for controlling the first gate driver on array signal line 1205 and the second gate driver on array signal line 1208 simultaneously. In this way, the first gate driver on array signal line 1205 and the second gate driver on array signal line 1208 can be scanned simultaneously. In addition, by disposing the two gate driver on array units oppositely, the fabrication process of the display panel can also be simplified.

Figure 11:
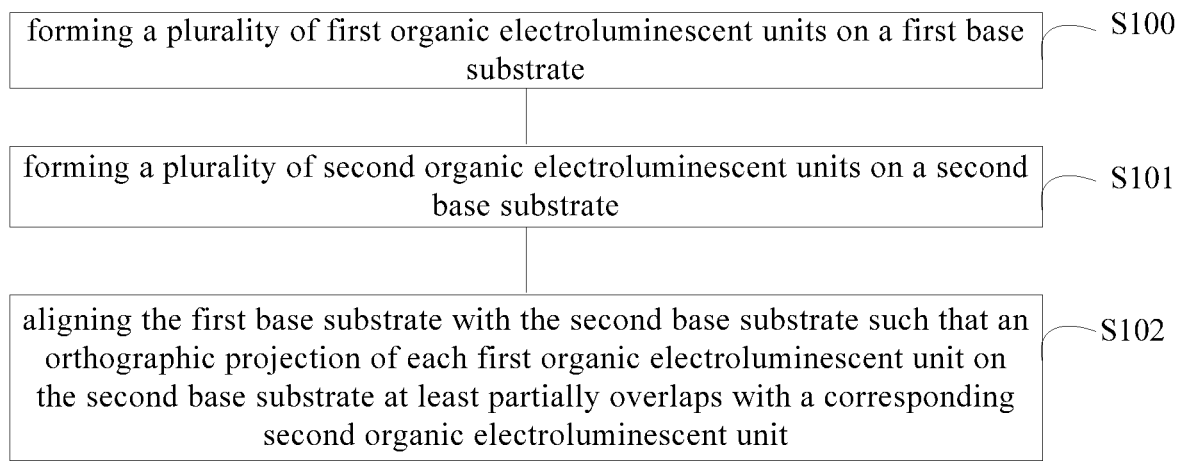
FIG. 11 shows a flow chart of a fabrication method for an organic electroluminescent display panel according to an exemplary embodiment.

According to exemplary embodiments of another aspect of the present disclosure, a fabrication method for an organic electroluminescent display panel is also provided. As shown in FIG. 11, the fabrication method may include the following steps.

S100, forming a plurality of first organic electroluminescent units 70 on a first base substrate 50.

Specifically, each first organic electroluminescent unit 70 may comprise a first electrode 21, a second electrode 31, and a functional layer 41 disposed between the first electrode 21 and the second electrode 31. In addition, when the first electrodes 21 of the first organic electroluminescent units 70 are electrically connected to drains of the thin film transistors, the second electrodes 31 of the respective first organic electroluminescent units 70 may be connected to each other. That is, the second electrodes 31 are forming a single layer. Alternatively, the second electrodes 31 of the respective first organic electroluminescent units 70 may also be independent of each other. As an example, the first electrode 21, the second electrode 31, and the functional layer 41 may be formed by a vapor deposition method.

Here, the above fabrication method may further comprise: forming a pixel circuit layer on the first base substrate 50 before forming the plurality of first organic electroluminescent units 70 on the first base substrate 50. Specifically, the pixel circuit layer may comprise thin film transistors (TFT) and a charging layer. After that, the plurality of first organic electroluminescent units 70 may be formed on the pixel circuit layer.

It is assumed that in the display panel as formed above, the first base substrate 50 is close to the display side. In this case, the above step S100 may further comprise: forming a black matrix pattern 902 and a color film layer 90 on the first base substrate 70 before forming the plurality of first organic electroluminescent units 70 on the first base substrate 50. As an example, the color film layer 90 may comprise a plurality of color resist units 901. In addition, alternatively, the above step S100 may further comprise: after forming the plurality of first organic electroluminescent units 70 on the first base substrate 50, forming a first planarization layer 701 on the plurality of first organic electroluminescent units 70.

S101, forming a plurality of second organic electroluminescent units 80 on the second base substrate 60.

Here, the process of forming the plurality of second organic electroluminescent units 80 on the second base substrate 60 is similar to the process of forming the plurality of first organic electroluminescent units 70 on the first base substrate 50, which will not described in detail herein.

In addition, it should be noted that step S100 may be performed before, after or simultaneously with step S101.

As an optional example, the above fabrication method may further comprise: forming a pixel circuit layer on the second base substrate 60 before forming the plurality of second organic electroluminescent units 80 on the second base substrate 60. Specifically, the pixel circuit layer may comprise thin film transistors (TFT) and a charging layer. After that, the plurality of second organic electroluminescent units 80 is formed on the pixel circuit layer.

It is assumed that in the display panel as formed above, the first base substrate 50 is close to the display side. In this case, the above step S101 may further comprise: forming a reflective layer 100 on the second base substrate 60 before forming the plurality of second organic electroluminescent units 80 on the second base substrate 60. In addition, in other exemplary embodiments, the step S101 may further comprise: after forming the plurality of second organic electroluminescent units 80 on the second base substrate 60, forming a second planarization layer 801 on the second organic electroluminescent units 80, and forming a post spacer 110 on the second planarization layer 801 at a position facing the pixel defining region directly.

S102, aligning the first base substrate with the second base substrate, such that an orthographic projection of each first organic electroluminescent unit 70 on the second base substrate at least partially overlaps with a corresponding second organic electroluminescent unit 80. This means that the plurality of first organic electroluminescent units 70 is disposed in one-to-one correspondence with the plurality of second organic electroluminescent units 80.

Specifically, the colors of light emitted by the first organic electroluminescent units 70 and the second organic electroluminescent units 80 which are disposed in one-to-one correspondence with each other can be selected according to practical applications. For example, the colors of light emitted by the first organic electroluminescent units 70 and the second organic electroluminescent units 80 may be the same. Alternatively, the color of light emitted by the first organic electroluminescent units 70 may also be different from that of the second organic electroluminescent units 80. Further, the first organic electroluminescent units 70 and the second organic electroluminescent units 80 may emit any one of the three primary colors of light. Of course, in other embodiments, the first organic electroluminescent units 70 and the second organic electroluminescent units 80 may also emit white light, or light of other colors than the three primary colors.

Further, the brightness of light emitted by the first organic electroluminescent unit 70 and the second organic electroluminescent unit 80 that are disposed correspondingly to each other may be the same or different.

Here, it should be noted that when the first base substrate and the second base substrate are aligned with each other, a seal may be applied onto an edge of the first base substrate 50 or an edge of the second base substrate 60, so as to bond the first base substrate and the second base substrate together.

Further, it should be noted that although the organic electroluminescent display panel comprises the first base substrate and the second base substrate disposed opposite to each other in the above exemplary embodiments, in an alternative embodiment, any of the first base substrate and the second base substrate may be replaced by other additional layers. As an example, in an alternative embodiment, the organic electroluminescent display panel comprises only one base substrate, wherein the first organic electroluminescent units and the second organic electroluminescent units are stacked on the sole base substrate. In such a case, further optionally, the organic electroluminescent display panel may further comprise other layers disposed on a side of the second organic electroluminescent units away from the first organic electroluminescent units, for example, a reflective layer. This means, alternatively, in the organic electroluminescent display panel described in any of the above exemplary embodiments, the second base substrate can be removed, and further, replaced by any other suitable layer. The present disclosure is intended to cover all such alternative equivalents.

Exemplary embodiments provide a fabrication method for an organic electroluminescent display panel. The organic electroluminescent display panel formed by such a fabrication method may comprise: a plurality of first organic electroluminescent units 70 formed on the first base substrate 50; and a plurality of second organic electroluminescent units 80 formed on the second base substrate 60. In this case, the first organic electroluminescent units 70 and the second organic electroluminescent units 80 can emit light simultaneously. Thus, as compared with the case where only one organic electroluminescent unit exists per sub-pixel unit of the organic electroluminescent display panel in conventional solutions, according to an embodiment of the present disclosure, each sub-pixel unit has two organic electroluminescent units. Therefore, with the organic electroluminescent display panel provided in exemplary embodiments, the display brightness of the organic electroluminescent display panel can be improved, so that the maximum brightness of the organic electroluminescent display panel is larger, thereby facilitating application of the large-size display panel and observation from a distance. Further, in an exemplary embodiment, the first organic electroluminescent units 70 and the second organic electroluminescent units 80 are disposed on two base substrates, respectively. On the one hand, this avoids the mutual influence between electrodes in the first organic electroluminescent units 70 and electrodes in the second organic electroluminescent units 80, thereby ensuring the display quality; and on the other hand, this also avoids the mutual influence between the first organic electroluminescent units 70 and the second organic electroluminescent units 80 during fabrication, thereby simplifying the fabricating process.

The above embodiments are only used for explanations rather than limitations to the present disclosure, the ordinary skilled person in the related technical field, in the case of not departing from the spirit and scope of the present disclosure, may also make various modifications and variations. Therefore, all the equivalent solutions also belong to the scope of the present disclosure, and the patent protection scope of the present disclosure should be defined by the claims.

The invention claimed is:

1. An organic electroluminescent display panel, comprising:
   a first base substrate and a second base substrate disposed opposite to each other;
   a plurality of first organic electroluminescent units disposed at intervals from each other on a side of the first base substrate facing the second base substrate;
   a plurality of second organic electroluminescent units disposed at intervals from each other on a side of the second base substrate facing the first base substrate;
   a first data signal line and a first driving signal line located on the first base substrate;
   a second data signal line, a third data signal line and a second driving signal line located on the second base substrate, wherein the first data signal line is electrically connected to the third data signal line by an anisotropic conductive film, and the first driving signal line is electrically connected to the second driving signal line by an anisotropic conductive film; and
   a driving module connected to the first organic electroluminescent units and the second organic electroluminescent units, and configured to drive the first organic electroluminescent units and the second organic electroluminescent units to emit light, the driving module comprising a first source driving module, a second source driving module and a gate driver on array unit located on the second base substrate, wherein the first source driving module is electrically connected to the third data signal line, the second source driving module is electrically connected to the second data signal line, and the gate driver on array unit is electrically connected to the second driving signal line, wherein the plurality of first organic electroluminescent units is spaced apart from the plurality of second organic electroluminescent units in a direction perpendicular to an extending plane of the first base substrate, and an orthographic projection of each first organic electroluminescent unit on the second base substrate at least partially overlaps with a corresponding second organic electroluminescent unit.

2. The organic electroluminescent display panel according to claim 1, wherein one of the second organic electroluminescent units, at least partially overlapping with the orthographic projection of one of the first organic electroluminescent units on the second base substrate, is configured to emit light of a same color as the one of the first organic electroluminescent units.

3. The organic electroluminescent display panel according to claim 1, wherein the first organic electroluminescent units are disposed closer to a light exit surface of the organic electroluminescent display panel than the second organic electroluminescent units.

4. The organic electroluminescent display panel according to claim 3, wherein at least one of the first organic electroluminescent units and the second organic electroluminescent units is configured to emit white light, and the organic electroluminescent display panel further comprises: a color film layer on a side of the first organic electroluminescent units away from the second organic electroluminescent units.

5. The organic electroluminescent display panel according to claim 3, further comprising:

a reflective layer on a side of the second organic electroluminescent units away from the first organic electroluminescent units.

6. The organic electroluminescent display panel according to claim 3, wherein each second organic electroluminescent unit comprises a first electrode, a functional layer and a second electrode stacked over each other on the second base substrate, and the first electrode is made of a reflective material.

7. The organic electroluminescent display panel according to claim 1, further comprising:

a first planarization layer on a side of the first organic electroluminescent units adjacent to the second organic electroluminescent units;

a second planarization layer on a side of the second organic electroluminescent units adjacent to the first organic electroluminescent units; and a post spacer between the first planarization layer and the second planarization layer.

8. The organic electroluminescent display panel according to claim 1, wherein the driving module is configured to drive the first organic electroluminescent units and the second organic electroluminescent units to emit light simultaneously.

9. The organic electroluminescent display panel according to claim 1, wherein the driving module comprises a first sub-driving module and a second sub-driving module, wherein the first sub-driving module is connected to the first organic electroluminescent units and configured to drive the first organic electroluminescent units to emit light, and the second sub-driving module is connected to the second organic electroluminescent units and configured to drive the second organic electroluminescent units to emit light.

10. The organic electroluminescent display panel according to claim 9, further comprising:

a first signal line on the first base substrate;

a second signal line on the second base substrate, wherein the first sub-driving module is located on the first base substrate and connected to the first signal line;

the second sub-driving module is located on the second base substrate and connected to the second signal line.

11. The organic electroluminescent display panel according to claim 9, further comprising:

a first signal line located on the first base substrate;

a second signal line and a third signal line located on the second base substrate, the first signal line being electrically connected to the third signal line, wherein the first sub-driving module and the second sub-driving module are located on the second base substrate, the first sub-driving module is connected to the third signal line, and the second sub-driving module is connected to the second signal line.

12. A fabrication method for an organic electroluminescent display panel, comprising:

forming a plurality of first organic electroluminescent units on a first base substrate;

forming a first data signal line and a first driving signal line on the first base substrate;

forming a plurality of second organic electroluminescent units on a second base substrate;

forming a second data signal line, a third data signal line and a second driving signal line on the second base substrate, wherein the first data signal line is electrically connected to the third data signal line by an anisotropic conductive film, and the first driving signal line is electrically connected to the second driving signal line by an anisotropic conductive film;

forming a driving module comprising a first source driving module, a second source driving module and a gate driver on array unit on the second base substrate, the driving module being connected to the first organic electroluminescent units and the second organic electroluminescent units and configured to drive the first organic electroluminescent units and the second organic electroluminescent units to emit light, wherein the first source driving module is electrically connected to the third data signal line, the second source driving module is electrically connected to the second data signal line, and the gate driver on array unit is electrically connected to the second driving signal line; and aligning the first base substrate with the second base substrate such that an orthographic projection of each first organic electroluminescent unit on the second base substrate at least partially overlaps with a corresponding second organic electroluminescent unit.

* * * * *